Feb. 23, 1954 L. M. MINSK ET AL 2,670,286
PHOTOSENSITIZATION OF POLYMERIC CINNAMIC ACID ESTERS
Filed Jan. 20, 1951
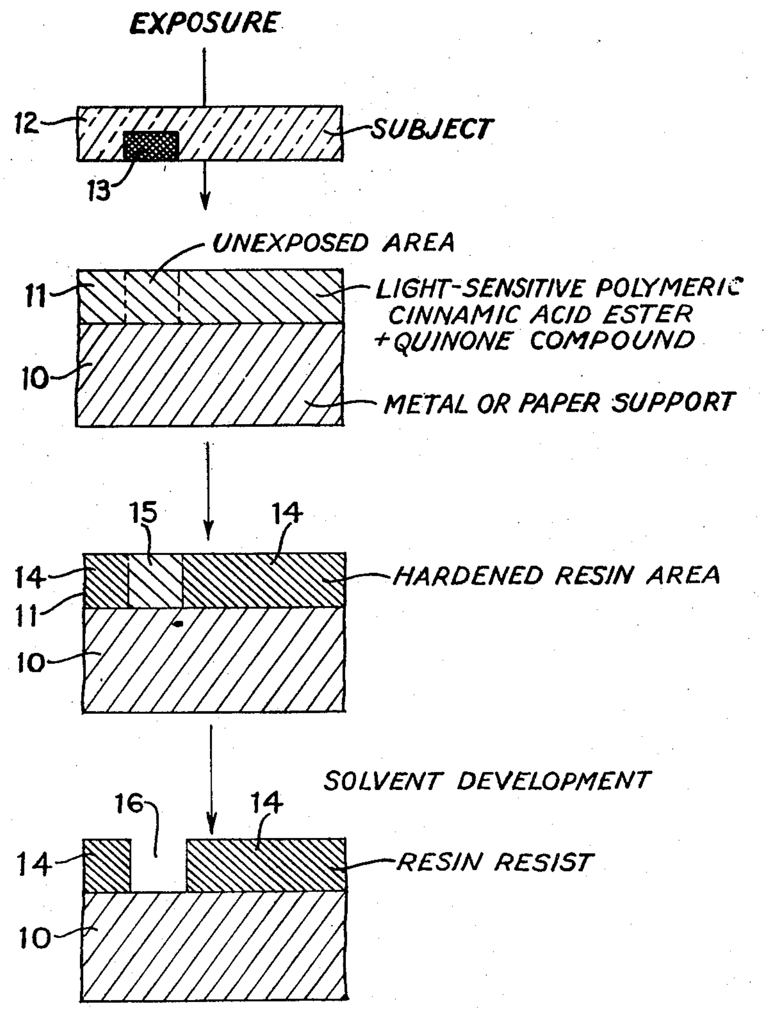
Louis M. Minsk
Werter P. Van Deusen
Earl M. Robertson
INVENTORS
BY Daniel I. Mayne
W. H. McDowell
ATTORNEY & AGENT Patented Feb. 23, 1954 2,670,286

UNITED STATES PATENT OFFICE 2,670,286

PHOTOSENSITIZATION OF POLYMERIC CINNAMIC ACID ESTERS

Louis M. Minsk, Werter P. Van Deusen, and Earl M. Robertson, Rochester, N. Y., assignors to Eastman Kodak Company, Rochester, N. Y., a corporation of New Jersey Application January 20, 1951, Serial No. 207,050

26 Claims. (Cl. 95—7)

This invention relates to the photosensitization of cinnamic acid esters of polymeric materials and more particularly to the photosensitization of cinnamic acid esters of polyvinyl alcohol and cellulose.

It is well known in the art of photomechanical reproduction to utilize various materials such as bichromated shellac, albumin or polyvinyl alcohol for forming resist images upon various supports such as metal plates. The support is then etched or otherwise treated in the areas not covered by the resist image and the resultant plate, usually after removal of the resist image, is used for printing. One method of forming relief images on metal supports is disclosed in the Murray U. S. Patent 1,965,710, granted July 10, 1934, and includes using as a sensitive layer for forming a resist image, a layer of cinnamal ketone containing another resinous material which, after exposure under a design, may be selectively dissolved in the unexposed area whereby the area of the support thus bared may be etched.

We have discovered certain polymeric materials which are light-sensitive and which have properties superior to the mentioned bichromated materials or cinnamal ketone. Furthermore, we have discovered that these polymeric materials can be sensitized to increase their sensitivity to actinic rays as much as a hundred times. Therefore, one object of our invention is to provide the superior light-sensitive materials of particular use in making resists for printing plates. A further object is to provide sensitizer compounds capable of increasing the light-sensitivity of the polymeric materials. Another object is to describe the preferred applications for the sensitized materials. Other objects will become apparent from the following description of our invention.

The objects of our invention are accomplished in part by utilizing a polymeric material containing cinnamoyl groups such as a cinnamic acid ester of polyvinyl alcohol or cellulose, preferably the former, as a combined carrier and light-sensitive material, and a quinone compound as a sensitizer for the cinnamic acid ester. Other objects are accomplished by utilizing the sensitive resist compositions for making resist images for printing plates. Suitable light-sensitive cinnamic acid esters are, for example, cinnamic acid esters of starch, polyvinyl alcohol and cellulose as well as of partially alkylated cellulose or polyvinyl alcohol, either completely or partially hydroxy-alkylated cellulose or polyvinyl alcohol, and partially esterified cellulose or polyvinyl alcohol. Other polymeric materials containing cinnamoyl groups, which are useful in our invention, are disclosed in the Allen et al. U. S. patent application Serial No. 771,142, filed August 28, 1947, now U. S. Patent 2,566,302 granted September 4, 1951, e. g., cinnamoylated polystyrene resins.

The polymeric materials sensitized with the quinone compounds are exposed in the usual manner to line or halftone subjects and after exposure are treated with a solvent to remove the coating only in the unexposed area of the plate and an intermediate plate is thus obtained provided with a resinous resist image useful in a variety of processes to form final printing plates.

In the accompanying drawings, the various figures show in enlarged cross-sectional view the structure of a representative sensitive element of our invention at various stages in the process of producing intermediate printing plates having selected areas covered by a polymeric resist image.

The light-sensitive polymeric materials of the invention are obtained by esterification of hydroxy containing polymeric materials such as cellulose or polyvinyl alcohol with a cinnamic acid halide such as cinnamic acid, o-chloro, or m-nitro cinnamic acid chlorides as follows:

*Polyvinyl cinnamate*

660 grams of medium viscosity polyvinyl alcohol were heated with 6 liters of a commercial grade of pyridine on a steam bath for 16 hours, followed by cooling and the addition of 6 liters of pyridine. 3 kg. of cinnamoyl chloride were then added with stirring and cooling. After the addition of the cinnamoyl chloride the reaction mixture was heated at 50° C. for 4 hours with stirring, diluted with 10 liters of acetone and the resultant solution precipitated in 36 gals. of distilled water. After stirring for 1 hour the resultant polyvinyl cinnamate resin was filtered off and washed with 17 gals. of distilled water. Five such batches of resin were combined and given 4 additional 1 hour washes with distilled water, the resin filtered off and dried at room temperature to constant weight. The yield was 25.5 lbs. of resin analyzing 99.4 mol. per cent vinyl cinnamate, the remainder being unesterified combined vinyl alcohol units. In a similar manner the resin may be esterified to a lesser extent by reducing the amount of acid chloride used and carefully controlling the conditions of esterification. However, it is desirable to esterify the resin to the point at which it becomes soluble in the solvent to be used for selectively developing the resist image, and generally if the polymer is at least about 60 mol. per cent esterified, it is satisfactory. While the useful polymers may contain from about 60 to 100 mol. per cent of vinyl cinnamate, the preferred polymers contain about 87 to 100 mol. per cent vinyl cinnamate because such polymers possess the combination of properties of maximum resistance to moisture and accordingly maximum attraction for greasy printing inks, and since such polymers are highly soluble in organic solvents, clean resists are obtained in the organic solvent development step. The sensitivity of the resin may in effect be varied by variation in molecular weight of the resins since the low molecular weight short chain polymers appear to require more exposure than do the higher polymers to obtain clean resists on development. Esterification of cellulose with the acid chlorides is carried out to the extent indicated in a comparable manner by treating the cellulose fiber or partially esterified cellulose esters with the desired acid chloride under conditions similar to the above.

A preferred hydrolysis method for making cinnamic acid esters of polyvinyl alcohol containing less than 99.4 mol. per cent vinyl cinnamate is given as follows:

100 grams of the polyvinyl cinnamate prepared as above were dissolved in 500 cc. of 1,4-dioxane and 200 cc. of methanol, followed by the addition of 1 gram of metallic sodium in 100 cc. of methanol. 300 cc. of 1,4-dioxane were then added with stirring until the mixture was homogenous. Samples were then removed at intervals, precipitated in distilled water, washed with water until free of alkali and then dried under vacuum. Samples taken at the intervals had the analysis shown in the following table based on carbon analyses.

| Sample No. | Sampling Interval (Min.) | Vinyl Cinnamate (Wt. Percent) | Vinyl Cinnamate (Mol. Percent) |
|---|---|---|---|
| 1 | 5 | 96.9 | 90.5 |
| 2 | 12 | 96.4 | 89.0 |
| 3 | 17 | 94.8 | 87.5 |
| 4 | 24 | 90.6 | 74.2 |
| 5 | 31 | 85.8 | 64.3 |
| 6 | 44 | 83.2 | 59.6 |

By the term "polyvinyl cinnamate" we mean to include only organic solvent-soluble light-sensitive esters of polyvinyl alcohol containing from about 60 to 100 mol. per cent of combined vinyl cinnamate groups, the balance being vinyl alcohol groups. Polyvinyl cinnamate of the insoluble type obtained by polymerization of vinyl cinnamate is not contemplated for use in our invention.

By the term "cinnamic acid esters of polyvinyl alcohol and cellulose" we mean organic solvent-soluble light-sensitive esters containing from about 60 to 100 mol. per cent of a combined cinnamoyl ester group. This includes simple as well as mixed esters, e. g., polyvinyl acetate cinnamates and cellulose acetate cinnamates, containing at least 60 mol. per cent cinnamoyl ester and the balance comprising a different acyl group or being unesterified or both.

A typical resist lacquer useful for forming resist images on printing plates is compounded of the following materials:

| | | |
|---|---|---|
| Polyvinyl cinnamate | grams | 2.5 |
| Methyl glycol acetate | cc | 100 |
| Quinone compound | gram | 0.25 |

When using a polymeric m-nitrocinnamic acid ester such as polyvinyl m-nitrocinnamate, we prefer to disperse the resin together with the sensitizer in nitrobenzene. The coatings made from this solution are preferably developed with nitrobenzene at a temperature of about 110° F. for about one minute. When using the cellulose cinnamate, it is preferable to disperse the ester in 1,4-dioxane for coating, and develop the resist image in 1,4-dioxane.

The solvents and solvent combinations for the coating composition as well as for the developer will vary somewhat depending upon the particular cinnamic acid ester in use as indicated above. For polyvinyl cinnamate of preferred composition indicated above, a variety of solvents can be used; for example, aromatic alcohols, ethers, ether-alcohols, esters, aldehydes, ketones, halogenated hydrocarbons, nitro hydrocarbons, and amines; heterocyclic alcohols, ethers, aldehydes, nitrogen ring compounds; and aliphatic ketones, particularly methyl ethyl ketone, as well as unsaturated ketones, diketones, ether-alcohol-esters, dibasic acid esters, chlorohydrins, N-alkyl substituted amides, nitroparaffines, and glacial acetic acid. Furfural, benzaldehyde, morpholine and acetophenone, in the order given, are most satisfactory from the standpoint of toxicity and fire hazard. Furfural, cyclohexanone and methyl glycol acetate are preferred when considering cost and evaporation rate. An excellent solvent combination, particularly for tank development in preparing resist images on copper and paper printing plates, is a mixture of methyl glycol acetate and xylene containing up to about four volumes of the latter. With the further addition of about one part of an alcohol, especially isopropyl alcohol, the printing plate, after exposure and development, can be washed in running water without causing the coating to blush. Furfural can be used in a similar manner. Addition of secondary solvents to coating compositions, in addition to the use of the primary solvent required to dissolve the resin, e. g. about 10 per cent methyl alcohol, has the advantage of increasing the solubility of certain of the quinone compound sensitizers in the major solvent such as chlorobenzene.

The developing action of a solvent which is only a partial solvent for the cinnamic acid esters can be improved by the addition of an acidic compound. For example, mixtures of xylene and methyl hydrogen adipate; xylene, isopropyl alcohol and either n-butyl hydrogen phthalate, phthalic acid or p-toluene sulfonic acid give marked improvement in half-tone image formation. Other partial solvents are toluene, ethyl benzene, cumene, trimethyl benzene, carbon tetrachloride, acetal, di-isopropyl ketone and butyl acetate whose solvent action is improved with the mentioned acid compounds as well as other lower alkyl half esters and phthalic acids, acetic acid, benzoic acid, nitro benzoic acids, other aliphatic dibasic acids such as oxalic, succinic, citric, malonic acids; unsaturated acids such as cinnamic, oleic and maleic acids.

An advantageous method for developing the sensitive compositions of the invention includes treatment of the exposed plate with solvent vapor, for example, of trichloroethylene or ethylene chloride in conventional vapor degreasing equipment. As a result, development is completed in a few seconds compared to several minutes when development is carried out in a tank of developer.

Similarly, spray development can be employed advantageously, according to which the developer solvent is sprayed, cold or hot, onto the surface of the exposed coating to effect removal of the polymer material in the unexposed regions.

The vapor and spray methods are also employed advantageously in the development of the sensitized and exposed layers of polymeric materials disclosed in the Minsk et al. U. S. patent applications Serial Nos. 207,048–9 and 207,051–2 all filed concurrently herewith.

The concentration of sensitizer compound in the coating formula depends somewhat upon the solubility in the particular solvent used, the compatibility of the sensitizer with the sensitive polymeric material and of course the amount of polymeric material present. In the case of polyvinyl cinnamate, from about 2 to 25 per cent, preferably 10 per cent, by weight of quinone compound based on the weight of polyvinyl cinnamate gives useful results. With certain sensitizers, e. g., 1,2-benzanthraquinone, an amount less than 2 per cent produces measurable speed increases. The concentration of polyvinyl cinnamate in the coating formula can be varied as required by the particular conditions of coating under consideration, about 2.5% resin being useful for grained metal or paper plates and about 7.5% for polished metal such as copper, zinc and magnesium.

Examples of quinone compounds which are suitable as sensitizers for the polymeric cinnamic acid esters, especially polyvinyl cinnamate, are tabulated in the following table, the numerical value opposite each compound indicating the relative speed obtained when using polyvinyl cinnamate as the sensitive polymeric material. The coatings from which the speed evaluations were obtained were made from solutions of one part of chlorobenzene and three parts of toluene by volume containing 2.5 grams of polyvinyl cinnamate and 0.25 gram of the quinone compound. A speed value of 2 represents the initial speed of the polyvinyl cinnamate. For comparison purposes on the same scale, a dichromate sensitized shellac coating would have a speed value of approximately 30.

*Substituted mono-nuclear quinones*

| | |
|---|---|
| Tolu-p-quinone | 5 |
| 2,6-dichloroquinone | 9 |
| Chloranil | 10 |
| 2,5-diphenyl-p-quinone | 20 |

*Poly-nuclear quinones*

| | |
|---|---|
| 1,2-naphthoquinone | 20 |
| 1,4-naphthoquinone | 60 |
| 9,10-anthraquinone | 100 |
| 9,10-phenanthraquinone | 5 |
| 1,2-benzanthraquinone | 500 |
| 2,3-benzanthraquinone | 60 |
| 2-methyl-1,4-naphthoquinone | 100 |
| β-Methylanthraquinone | 200 |
| 2,3-dichloronaphthoquinone | 100 |
| β-Chloroanthraquinone | 200 |
| 2-nitro-9,10-phenanthraquinone | 100 |
| 2,7-dinitro-9,10-phenanthraquinone | 100 |
| 2,2'-dianthraquinonylethylene | 300 |
| 6,11-acenaph (1,2-a) anthraquinone | 300 |
| 5,6-chrysene quinone | 9 |
| Amphi-6,12-chrysene quinone | 6 |
| 3,8-pyrenquinone | 6 |
| 1,4-dimethylanthraquinone | 60 |
| 2,3-dimethylanthraquinone | 200 |
| β-Phenylanthraquinone | 300 |
| 1,2-tetral anthraquinone | 60 |
| 2,3-tetral anthraquinone | 200 |
| 2,3-diphenylanthraquinone | 300 |
| Acenaphthenequinone | 70 |
| 5,7,12,14-pentacenediquinone | 40 |
| β-Dimethylaminoanthraquinone | 10 |

The compounds are unique in their sensitizing effect, i .e., resins and polymeric materials other than indicated herein, e. g., polyvinyl alcohol, are not sensitized by the quinone compounds.

The following compounds either behave as very weak sensitizers for the cinnamic acid esters or actually exhibit a desensitizing effect:

Benzoquinone
2-aminonaphthoquinone
1,4-diaminoanthraquinone
1 - methylamino-4-(β-methoxyethylamino)-9,10-anthraquinone
Quinhydrone
Quinizarin
Sodium - 1 - hydroxy - 4-nitro-anthraquinone-2-sulfonate
1-aminoanthraquinone
1-dimethylaminoanthraquinone
1,4-tetramethyldiaminoanthraquinone The compounds exhibiting the desired sensitizing effect are, accordingly, classifiable as polynuclear quinones and substituted mononuclear quinones, all of which are free of basic nitrogen-containing and hydroxyl groups in positions peri and ortho to an oxo group, carboxyl and sulfo groups.

The desensitizing effect, for example, of 1,4-diaminonaphthoquinone can possibly be attributed to the presence in the molecule of an amino group in the mentioned positions relative to a carbonylic group making chelation possible. Hydroxyl substitution appears to influence the sensitizing properties of the quinones for the same reason. Besides their poor sensitizing effect, the sulfonated and carboxylated compounds are less desirable because of their low solubility in organic solvents used in dissolving the cinnamic acid esters and developing the resist image after exposure. The desired system is that in which the polymer, the sensitizer, solvent and developer are essentially hydrophobic materials.

The quinone compounds of the invention are further broadly classifiable as compounds containing a carbocyclic ring containing an oxo group and at least three unsaturated carbon atoms, one of which atoms is attached to the oxo group, and the compounds being free of basic nitrogen-containing ring substituents and hydroxyl groups in positions peri and ortho to an oxo group, carboxyl and sulfo groups. The anthrone compounds disclosed and claimed as sensitizers in our copending application, Serial No. 207,049, filed concurrently, also fall under this classification. The quinone compounds of the present invention, of course, contain two oxo-carbonylic groups attached to the unsaturated carbon atoms.

By the term "resist composition" as used herein and in the appended claims, we mean a system containing as its essential ingredients one of the polymeric cinnamic acid esters and one of the quinones mentioned either as a solid mixture of chemicals, for example, as in a coating on a support, or as a solution of the materials in a solvent.

Referring to the above tables, it will be apparent that the polynuclear quinones including the anthraquinones and naphthoquinones comprise the more important sensitizers for the resist compositions. While the benzanthraquinones provide the best sensitizer, valuable sensitizers can be selected from the di- and tri-nuclear quinones.

Our invention will be understood by consideration of the accompanying drawings and the following examples illustrating various means of employing the light-sensitive polymeric materials for forming resist images and printing plates therefrom.

*Example 1*

A cinnamic acid ester such as polyvinyl cinnamate (2.5 grams), the preparation of which is described above, was dissolved in 100 cc. of methyl glycol acetate and 0.25 gram of 1,2-benzanthraquinone was then dissolved in the resinous dope. The order of mixing the components is not especially critical. The resist composition in liquid form was then poured onto a lithographic paper printing plate support such as a paper sheet carrying a layer of material which is repellent to greasy printing inks when wet and the coated plate was whirled at approximately 50 to 100 R. P. M. until the coating was dry. The operation is preferably carried out in subdued light. The sensitized plate appears as shown in enlarged cross-sectional view in the first stage of the drawings wherein layer 10 represents the paper support and layer 11 the polyvinyl cinnamate sensitized with the quinone compound. The plate was then exposed under a line or halftone image at 4 feet from a 35-ampere white flame carbon arc for about 1 minute, as shown in the first stage of the drawings wherein the subject is represented by a transparent layer 12 containing an image 13 opaque to light. The result of exposure is to insolubilize the layer in the exposed region 14 of layer 11 leaving unaffected material in the unexposed area 15 as shown in the drawings. After exposure, development was carried out for two minutes in a tray of methyl ethyl ketone. The result was that the unexposed area 15 of the plate was readily dissolved leaving a resin resist 14 on the support 10 and in the unexposed areas 16 from which the resin and sensitizer had been removed, the ink-repellent area of the support was revealed. If desired, the resist can now be dyed, with a suitable dye to increase its visibility, dye being selected which does not stain the non-printing areas 16. At this stage the plate can be used as a lithographic printing plate or further processed depending upon the particular support which has been used or the photomechanical process under consideration. Thus, when applying the above procedure to making etched zinc halftone images, the above type of coating was coated on a degreased photoengraving zinc plate, dried, exposed, developed and etched for four minutes with 10 per cent nitric acid solution, to which a wetting agent may be added, to obtain a relief plate. The plate was then rubbed to remove the resist, the removal being aided, if desired, by use of a solvent such as benzene or acetone.

When adapting the sensitive materials of the invention to producing bimetallic lithographic plates containing chromium line or halftone images the resist is formed on a degreased copper plate following which the plate is chrome plated under the usual conditions. During the preparation of such a plate the operations of baking and swabbing the plate customarily employed when certain bichromated resists are in use can be dispensed with. If desired, the resist can be formed on a chromium plated copper plate followed by etching out the chromium.

When producing etched copper halftone images, the resist is formed on a degreased copper plate in the manner of Example 1 and then the plate is etched with ferric chloride solution. During this operation it is not necessary to employ the usual "burning in" of the resist customarily employed with other materials nor is it necessary to scrub the plate during the etching operation to observe side action. Also, the resist can be removed from the etched plate using solvent and scrubbing which is relatively simple compared to the use of hot concentrated alkali solution usually employed for removing resist images. The procedure can also be applied to making etched zinc or magnesium halftone plates in processes formerly using dichromated shellac. However, the usual temperature and humidity controls are not necessary.

The light-sensitive polymeric compositions of the invention are also useful in forming printing plates having a cellulose ester support. The sensitive composition is coated on a sheet of, for example, cellulose triacetate film base and after forming the resist image thereon in the manner of Example 1, with the exception that benzene should be used for development, the areas of the cellulose ester support bared in the development step are hydrolyzed with a solution of sodium hydroxide in aqueous alcohol, the result of which is a printing plate which when moistened with water repels the usual greasy printing inks in the hydrolyzed region while the ink adheres to the relief resist image and the plate is suitable for use on a lithographic press. However, prior to printing, it is preferred to remove the resist.

When preparing an ink-carrying resist image on grained zinc or aluminum lithographic plates, the sensitive materials of the invention such as the compositions above mentioned are coated on grained zinc or aluminum plates. Following somewhat the conventional technique of treating plates coated with albumin, the plate is etched in five per cent acetic acid or ½% hydrochloric acid, dried, and coated with the resist lacquer. After exposure and development, the plate is gum etched and then is ready for the press. The conventional steps of swabbing the plate during development or use of a developing ink are not necessary and use of the resist of the invention provides the photolithographer with a much simplified process for producing plates having high press endurance.

Zincated lithographic printing plates can be prepared by forming the resist on a zincated aluminum plate by means of exposure and development as in Example 1 with the result that the area of the plate bared during the developing step is repellent to ink and the resist image formed carries the ink in the printing operation. In making zincated plates the aluminum plate can be first chromatized, then after coating the sensitive layer of the invention followed by exposure and development, the plate can be zincated. In a similar manner, resist images may be formed on dyed anodized aluminum plates without zincating which may be etched in the conventional manner, or if desired, the resist may be formed on a glass plate and etching carried out by means of hydrofluoric acid.

The sensitive compositions of the invention can be used in a process of making ungrained copper printing plates which may be used for pre-proving a copper-chromium bimetallic plate. The process includes forming the resist image on a copper plate, then treating the plate with a cyanide-silver nitrate solution to deposit silver in the bare areas of the copper plate which then become ink-repellent, the resist being ink-receptive. A number of prints can be made from the plate at this stage. If a bimetallic plate is to be made later, the silver can be removed and those areas chromium plated. For removing the silver overlying the copper in the regions not occupied by the resist, a solution of a copper salt and an alkali metal halide may be used. As a result of the removal of the silver, contamination of the chromium plating bath used subsequently to form the copper-chromium bimetallic plate is prevented.

After preparing the resist on grained zinc plates as described above, the durability of the plate can be increased by the electrodeposition of additional zinc around the developed resist image. Similarly, after preparing the resist on a copper plate, copper photoengraving can be prepared by etching away the copper electrolytically in the areas of the plate not covered by the resist, using a conventional sodium chloride bath.

In a similar manner, any of the mentioned sensitizers can be incorporated into a solvent system containing a polymeric cinnamic acid ester especially polyvinyl cinnamate and the resultant composition used for making a printing plate.

It will be apparent from the above description that the preferred process of our invention broadly contemplated includes the steps of exposing a layer of a cinnamic acid ester of polyvinyl alcohol containing as a sensitizer a quinone compound activating the ester in the presence of actinic rays to render the ester insoluble and then dissolving only the unexposed area of the layer with an organic solvent leaving the ester on the support in relief form in only the exposed area.

The preferred light-sensitive coatings of our invention broadly contemplated include light-sensitive coatings comprising a cinnamic acid ester of polyvinyl alcohol and as a sensitizer a quinone compound activating the ester in the presence of actinic rays to render it insoluble in an organic solvent.

The mechanism of the activation is not fully understood. However, it does enable the insolubility to be obtained with shorter exposures to light.

As indicated above, the type of printing plate obtained depends somewhat upon the support used. Resists on grained metal and zincated supports have been described, these supports having their surfaces thus prepared, when moistened with water, are repellent to the usual greasy printing inks. Cellulose ester supports subsequently surface hydrolyzed have been mentioned and other ink-repellent surfaces which may be provided with resist images according to our invention include plates or fibrous supports having a hydrophilic surface, for example, of water permeable cellulose ether, polyvinyl alcohol, partially hydrolyzed polyvinyl esters, gum arabic, acrylic acid polymers and co-polymers, casein, and the like. The mentioned techniques for making aluminum plates can be employed for making an aluminum plate having aluminum foil as the metal support. In this instance, since handling of thin foil is difficult, it is preferable to reinforce it, for example, by lamination with a paper backing, the surface away from the metal foil preferably carrying a water resistant coating such as wax, cellulose ester or synthetic resin applied subsequent or prior to lamination.

We have found that when employing the light-sensitive materials of the invention for making printing plates, polyvinyl cinnamate is the most suitable of the polymeric materials since development of exposed layers of this resin give cleaner differentiation between the exposed and unexposed regions of a plate and it has superior adhesion to supports. Under certain conditions, cellulose cinnamate may be desired but polyvinyl cinnamate is more generally useful. In all cases, the synthetic polymeric materials give cleaner resist images under much less critical conditions of development than have been obtainable by use of bichromated materials, or previously described sensitive materials containing the cinnamal group, that is, there is no tendency for the cinnamate resist image to be dissolved away during development. A further advantage of our sensitive materials lies in the fact that solutions and coatings of the polymeric esters containing our sensitizers may be made considerably in advance of the time of actual usage and after storage are found to have been little affected by non-ideal conditions of temperature and humidity. Bichromated glue or alubumin layers can be sensitized only slightly in advance of usage because of their poor keeping properties. Other advantages of our sensitive materials have been noted in the above examples. Accordingly, an advantage of the quinone sensitizers of the present invention over the nitro-compound sensitizers of the co-pending Minsk et al., U. S. patent application Serial No. 148,684, filed March 9, 1950, now U. S. Patent 2,610,120 granted September 9, 1952, lies in the fact that the quinone compounds are in general better sensitizers and they are less explosive and allergenic.

What we claim is:

1. A photomechanical resist composition comprising a polymeric material selected from the group consisting of cinnamic acid esters of polyvinyl alcohol and cellulose as a combined carrier and light-sensitive material, and as a sensitizer for the composition, a polynuclear quinone free of basic nitrogen-containing groups, hydroxyl, carboxyl and sulfo groups.

2. A photomechanical resist composition comprising polyvinyl cinnamate as a combined carrier and light-sensitive material, and as a sensitizer for the composition, a polynuclear quinone free of basic nitrogen-containing groups, hydroxyl, carboxyl and sulfo groups.

3. A photomechanical resist composition comprising polyvinyl cinnamate as a combined carrier and light-sensitive material, and as a sensitizer for the composition, a compound selected from the group consisting of 1,4-naphthoquinone
9,10-anthraquinone
1,2-benzanthraquinone
2-methyl-1,4-naphthoquinone
$\beta$-Methylanthraquinone
$\beta$-Chloroanthraquinone
2,3-dichloronaphthoquinone
2-nitro-9,10-phenanthraquinone
2,7-dinitro-9,10-phenanthraquinone
2,2'-dianthraquinonylethylene 6,11-acenaphth (1,2-a) anthraquinone
2,3-dimethylanthraquinone
$\beta$-Phenylanthraquinone
2,3-tetralanthraquinone
2,3-diphenylanthraquinone
1,2-tetralanthraquinone
5,7,12,14-acenaphthenequinone 4. A photomechanical resist composition comprising polyvinyl cinnamate as a combined carrier and light-sensitive material and as a sensitizer for the composition, an anthraquinone free of basic nitrogen-containing groups, hydroxyl, carboxyl and sulfo groups.

5. A photomechanical resist composition comprising polyvinyl cinnamate as a combined carrier and light-sensitive material, and as a sensitizer for the composition, a naphthoquinone compound free of basic nitrogen-containing groups, hydroxyl, carboxyl and sulfo groups.

6. A photomechanical resist composition comprising polyvinyl cinnamate as a combined carrier and light-sensitive material, and as a sensitizer for the composition, a benzanthraquinone compound free of basic nitrogen-containing groups, hydroxyl, carboxyl and sulfo groups.

7. A photomechanical resist composition comprising polyvinyl cinnamate as a combined carrier and light-sensitive material and as a sensitizer for the composition, a phenanthraquinone compound free of basic nitrogen-containing groups, hydroxyl, carboxyl and sulfo groups.

8. A photomechanical resist composition comprising polyvinyl cinnamate as a combined carrier and light-sensitive material and as a sensitizer for the composition, a 1,4-naphthoquinone compound free of basic nitrogen-containing groups, hydroxyl, carboxyl and sulfo groups.

9. A photomechanical resist composition comprising polyvinyl cinnamate as a combined carrier and light-sensitive material, and as a sensitizer for the composition, a 9,10-phenanthraquinone compound free of basic nitrogen-containing groups, hydroxyl, carboxyl and sulfo groups.

10. A photomechanical resist composition comprising polyvinyl cinnamate as a combined carrier and light-sensitive material, and as a sensitizer for the composition, a 7-nitro-9,10-phenanthraquinone compound free of basic nitrogen-containing groups, hydroxyl, carboxyl and sulfo groups.

11. A photomechanical resist composition comprising polyvinyl cinnamate as a combined carrier and light-sensitive material, and as a sensitizer for the composition, 7-nitro-9,10-phenanthraquinone.

12. A photomechanical resist composition comprising polyvinyl cinnamate as a combined carrier and light-sensitive material, and as a sensitizer for the composition, a 9,10-anthraquinone compound free of basic nitrogen-containing groups, hydroxyl, carboxyl and sulfo groups.

13. A photomechanical resist composition comprising polyvinyl cinnamate as a combined carrier and light-sensitive material, and as a sensitizer for the composition, a $\beta$-substituted 9,10-anthraquinone compound free of basic nitrogen-containing groups, hydroxyl, carboxyl and sulfo groups.

14. A photomechanical resist composition comprising polyvinyl cinnamate as a combined carrier and light-sensitive material, and as a sensitizer for the composition, a $\beta$-alkyl-9,10-anthraquinone compound free of basic nitrogen-containing groups, hydroxyl, carboxyl and sulfo groups.

15. A photomechanical resist composition comprising polyvinyl cinnamate as a combined carrier and light-sensitive material, and $\beta$-methyl-9,10-anthraquinone as a sensitizer for the composition.

16. A photomechanical resist composition comprising polyvinyl cinnamate as a combined carrier and light-sensitive material, and as a sensitizer for the composition, a 1,2-benzanthraquinone compounds free of basic nitrogen-containing groups, hydroxyl, carboxyl and sulfo groups.

17. A photomechanical resist composition comprising polyvinyl cinnamate as a combined carrier and light-sensitive material, and 1,2-benzanthraquinone as a sensitizer for the composition.

18. A photomechanical resist composition comprising polyvinyl cinnamate as a combined carrier and light-sensitive material, and as a sensitizer for the composition, a $\beta$-substituted 1,4-naphthoquinone compound free of basic nitrogen-containing groups, hydroxyl, carboxyl and sulfo groups.

19. A photomechanical resist composition comprising polyvinyl cinnamate as a combined carrier and light-sensitive material, and as a sensitizer for the composition, a $\beta$-alkyl substituted 1,4-naphthoquinone compound free of basic nitrogen-containing groups, hydroxyl, carboxyl and sulfo groups.

20. A photomechanical resist composition comprising polyvinyl cinnamate as a combined carrier and light-sensitive material, and $\beta$-methyl 1,4-naphthoquinone as a sensitizer for the composition.

21. A photomechanical resist composition comprising polyvinyl cinnamate as a combined carrier and light-sensitive material, and as a sensitizer for the composition, a $\beta$-halogen substituted 1,4-naphthoquinone compound free of basic nitrogen-containing groups, hydroxyl, carboxyl and sulfo groups.

22. A photomechanical resist composition comprising polyvinyl cinnamate as a combined carrier and light-sensitive material, and $\beta$-chloro 1,4-naphthoquinone as a sensitizer for the composition.

23. A light-sensitive coating comprising a cinnamic acid ester of polyvinyl alcohol, and as a sensitizer for the ester, a polynuclear quinone free of basic nitrogen-containing groups, hydroxyl, carboxyl and sulfo groups and said quinone activating the ester in the presence of actinic rays to render it insoluble in an organic solvent.

24. A method of producing a printing plate which comprises exposing to a subject a supported layer of a cinnamic acid ester of polyvinyl alcohol containing as a sensitizer for the ester, a polynuclear quinone free of basic nitrogen-containing groups, hydroxyl, carboxyl and sulfo groups and said quinone activating the ester in the presence of actinic rays to render it insoluble in an organic solvent, thereby insolubilizing the ester in the exposed region of the layer, thereafter dissolving away only the unexposed region of the layer with an organic solvent leaving the ester on the support in relief form only in the exposed region.

25. A light-sensitive photographic element comprising a support having thereon a layer of polyvinyl cinnamate containing as a light-sensitizing agent, a polynuclear quinone free of basic nitrogen-containing groups, hydroxyl, carboxyl and sulfo groups.

26. A light-sensitive photographic element comprising a support having thereon a layer of polyvinyl cinnamate containing as a light-sensitizing agent, a compound selected from the group consisting of 1,4-naphthoquinone
9,10-anthraquinone
1,2-benzanthraquinone
2-methyl-1,4-naphthoquinone
β-Methylanthraquinone
β-Chloroanthraquinone
2,3-dichloronaphthoquinone
2-nitro-9,10-phenanthraquinone
2,7-dinitro-9,10-phenanthraquinone
2,2'-dianthraquinonylethylene
6,11-acenaphth(1,2-a) anthraquinone
2,3-dimethylanthraquinone
β-Phenylanthraquinone
2,3-tetralanthraquinone
2,3-diphenylanthraquinone
1,2-tetralanthraquinone
5,7,12,14-acenaphthenequinone

LOUIS M. MINSK.
WERTER P. VAN DEUSEN.
EARL M. ROBERTSON.

References Cited in the file of this patent

UNITED STATES PATENTS

| Number | Name | Date |
|---|---|---|
| 2,118,864 | Reppe et al. | May 31, 1938 |
| 2,273,891 | Pollack et al. | Feb. 24, 1942 |
| 2,318,959 | Muskat et al. | May 11, 1943 |
| 2,332,900 | D'Alelio | Oct. 26, 1943 |

FOREIGN PATENTS

| Number | Country | Date |
|---|---|---|
| 618,181 | Great Britain | Feb. 17, 1949 |

OTHER REFERENCES

Plastics, February 1948, page 82.